(12) United States Patent
Imura

(10) Patent No.: US 8,766,610 B2
(45) Date of Patent: Jul. 1, 2014

(54) MULTI-STAGE VOLTAGE REGULATOR

(71) Applicant: Seiko Instruments Inc., Chiba (JP)

(72) Inventor: Takashi Imura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 13/742,973

(22) Filed: Jan. 16, 2013

(65) Prior Publication Data

US 2013/0181777 A1 Jul. 18, 2013

(30) Foreign Application Priority Data

Jan. 18, 2012 (JP) .................... 2012-008275

(51) Int. Cl.
*G05F 1/56* (2006.01)

(52) U.S. Cl.
USPC ........................................ 323/280; 330/252

(58) Field of Classification Search
CPC .................................... H03F 3/42; H03F 3/72
USPC ......... 323/224, 226, 269, 270, 273, 274, 280; 330/252, 253, 255, 260, 261
See application file for complete search history.

(56) References Cited

U.S. PATENT DOCUMENTS

| | | | |
|---|---|---|---|
| 6,046,577 A * | 4/2000 | Rincon-Mora et al. ........ | 323/282 |
| 6,566,952 B1 * | 5/2003 | Allan ............................ | 330/255 |
| 6,801,419 B2 * | 10/2004 | Fukui ........................... | 361/93.1 |
| 6,958,643 B2 * | 10/2005 | Rosenthal ..................... | 327/540 |
| 7,420,414 B2 * | 9/2008 | Suzuki .......................... | 330/127 |
| 7,755,339 B2 * | 7/2010 | Kojima et al. ................ | 323/280 |
| 2003/0102851 A1 * | 6/2003 | Stanescu et al. .............. | 323/280 |
| 2004/0140845 A1 * | 7/2004 | Eberlein ....................... | 327/541 |
| 2008/0197829 A1 * | 8/2008 | Nagata et al. ................. | 323/316 |
| 2010/0240177 A1 * | 9/2010 | Shima ........................... | 438/221 |

FOREIGN PATENT DOCUMENTS

JP     2005-311689 A     11/2005

* cited by examiner

*Primary Examiner* — Adolf Berhane
*Assistant Examiner* — Emily P Pham
(74) *Attorney, Agent, or Firm* — Brinks Gilson & Lione

(57) ABSTRACT

Provided is a voltage regulator capable of reducing an influence of an offset to obtain an accurate output voltage. The voltage regulator includes: a first stage amplifier for amplifying and outputting a difference between a reference voltage and a divided voltage obtained by dividing a voltage output by an output transistor, to thereby control a gate of the output transistor; and a cascode amplifier circuit, in which the first stage amplifier includes: a first high breakdown voltage NMOS transistor as an input transistor; and an NMOS transistor as a tail current source, and in which the cascode amplifier circuit includes a second high breakdown voltage NMOS transistor as a cascode transistor.

18 Claims, 1 Drawing Sheet

MULTI-STAGE VOLTAGE REGULATOR

RELATED APPLICATIONS

This application claims priority under 35 U.S.C. §119 to Japanese Patent Application No. 2012-008275 filed on Jan. 18, 2012, the entire content of which is hereby incorporated by reference.

BACKGROUND OF THE INVENTION

1. Field of the Invention

The present invention relates to a voltage regulator with a reduced influence of an offset.

2. Description of the Related Art

FIG. 2 is a circuit diagram illustrating a conventional amplifier circuit.

In the conventional amplifier circuit, a drain of a normal breakdown voltage NMOS transistor 301 and a source of a high breakdown voltage NMOS transistor 302 are connected to each other, and a drain of the high breakdown voltage NMOS transistor 302 is connected to an output terminal 311. In this manner, a high load impedance can be set to obtain a large output voltage swing, and hence the gain of the amplifier circuit as a whole can be increased (see, for example, Japanese Patent Application Laid-open No. 2005-311689).

In a conventional voltage regulator, however, if an amplifier is formed by a cascode amplifier circuit using a high breakdown voltage MOS transistor, an offset is generated in the first stage amplifier.

SUMMARY OF THE INVENTION

The present invention provides a voltage regulator capable of reducing an offset of an amplifier to obtain an accurate output voltage.

In order to solve the conventional problem, the present invention is structured as described below.

According to an exemplary embodiment of the present invention, there is provided a voltage regulator, including: a first stage amplifier for amplifying and outputting a difference between a reference voltage and a divided voltage obtained by dividing a voltage output by an output transistor, to thereby control a gate of the output transistor; and a cascode amplifier circuit, in which the first stage amplifier includes: a first high breakdown voltage NMOS transistor as an input transistor; and an NMOS transistor as a tail current source, and in which the cascode amplifier circuit includes a second high breakdown voltage NMOS transistor as a cascode transistor.

According to the voltage regulator of the present invention, an offset to be generated in the first stage amplifier can be reduced, and hence the drivability can be ensured without increasing the size of the tail current source.

DETAILED DESCRIPTION OF THE PREFERRED EMBODIMENTS

Figure 1:
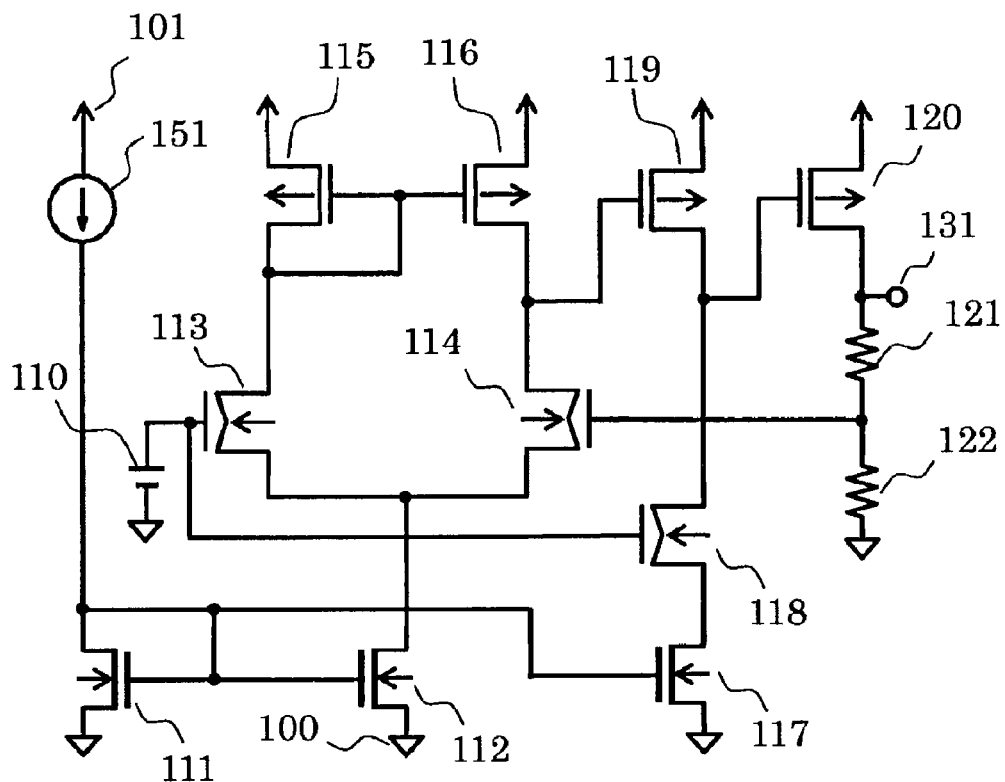
FIG. 1 is a circuit diagram illustrating a voltage regulator according to an embodiment of the present invention.
Figure 2:
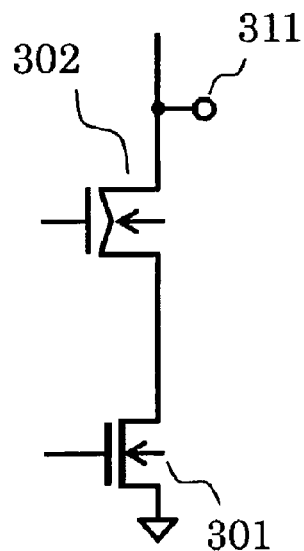
FIG. 2 is a circuit diagram of a conventional cascode amplifier circuit using a high breakdown voltage MOS transistor.

FIG. 1 is a circuit example of a voltage regulator according to an embodiment of the present invention.

The voltage regulator in this embodiment includes PMOS transistors 115, 116, 119, and 120, high breakdown voltage NMOS transistors 113, 114, and 118, NMOS transistors 111, 112, and 117, a reference voltage circuit 110, a constant current circuit 151, resistors 121 and 122, an output terminal 131, a power supply terminal 101, and a ground terminal 100.

Next, connections in the voltage regulator are described. The constant current circuit 151 has one terminal connected to the power supply terminal 101 and the other terminal connected to a gate and a drain of the NMOS transistor 111. The NMOS transistor 111 has a source connected to the ground terminal 100. The NMOS transistor 112 has a gate connected to the gate of the NMOS transistor 111, a drain connected to sources of the high breakdown voltage NMOS transistors 113 and 114, and a source connected to the ground terminal 100. The NMOS transistor 117 has a gate connected to the gate of the NMOS transistor 111, a drain connected to a source of the high breakdown voltage NMOS transistor 118, and a source connected to the ground terminal 100. The high breakdown voltage NMOS transistor 113 has a gate connected to one terminal of the reference voltage circuit 110, and a drain connected to a gate and a drain of the PMOS transistor 115. The reference voltage circuit 110 has the other terminal connected to the ground terminal 100. The high breakdown voltage NMOS transistor 114 has a gate connected to a node between one terminal of the resistor 121 and one terminal of the resistor 122, and a drain connected to a drain of the PMOS transistor 116. The PMOS transistor 115 has a source connected to the power supply terminal 101. The PMOS transistor 116 has a gate connected to the gate of the PMOS transistor 115, and a source connected to the power supply terminal 101. The high breakdown voltage NMOS transistor 118 has a gate connected to the gate of the high breakdown voltage NMOS transistor 113, and a drain connected to a drain of the PMOS transistor 119. The PMOS transistor 119 has a gate connected to the drain of the PMOS transistor 116, and a source connected to the power supply terminal 101. The PMOS transistor 120 has a gate connected to the drain of the PMOS transistor 119, a drain connected to the output terminal 131, and a source connected to the power supply terminal 101. The resistor 121 has the other terminal connected to the output terminal 131. The resistor 122 has the other terminal connected to the ground terminal 100.

Next, the operation of the voltage regulator in this embodiment is described. The resistors 121 and 122 divide an output voltage Vout as a voltage of the output terminal 131, and output a divided voltage Vfb. The high breakdown voltage NMOS transistors 113 and 114, the PMOS transistors 115 and 116, and the NMOS transistor 112 form a first stage amplifier. The high breakdown voltage NMOS transistor 118, the PMOS transistor 119, and the NMOS transistor 117 form a second stage amplifier. The PMOS transistor 120 operates as an output transistor. The divided voltage Vfb is compared with an output voltage Vref of the reference voltage circuit 110, and a gate voltage of the PMOS transistor 120 is controlled so that the output voltage Vout of the output terminal 131 becomes constant. When the output voltage Vout is higher than a predetermined voltage, the divided voltage Vfb is higher than the reference voltage Vref. Then, an output signal of the second stage amplifier (the gate voltage of the PMOS transistor 120) becomes higher, and the PMOS transistor 120 is gradually turned OFF to reduce the output voltage Vout. In this manner, the output voltage Vout is controlled to be constant. On the other hand, when the output voltage Vout is lower than the predetermined voltage, the operation reverse to the above is performed to increase the output voltage Vout. In this manner, the voltage regulator in this embodiment controls the output voltage Vout to be constant.

The high breakdown voltage NMOS transistor 118 operates as a cascode transistor. The high breakdown voltage NMOS transistor is structured to have lower drivability and higher breakdown voltage than the NMOS transistor. The high breakdown voltage NMOS transistor 118 and the NMOS transistor 117 form a cascode amplifier circuit, and hence the drivability can be ensured without increasing the size. The high breakdown voltage NMOS transistors 113 and 114 serving as input transistors of the first stage amplifier have the same structure as the high breakdown voltage NMOS transistor 118. Thus, the influence of an offset to be generated by the input transistors of the first stage amplifier can be reduced. As a tail current source of the first stage amplifier, the NMOS transistor 112 structured to have high drivability and low breakdown voltage is used. Thus, the circuit area can also be reduced while ensuring the drivability.

As described above, according to the voltage regulator of this embodiment, an offset to be generated in the first stage amplifier can be reduced, and hence the drivability can be ensured without increasing the size of the tail current source.

What is claimed is:

1. A voltage regulator, comprising:
an output transistor operable to adjust an output voltage of the voltage regulator;
a first stage amplifier operable to amplify and output a first stage output signal representing a difference between a reference voltage and a divided voltage obtained by dividing the output voltage; and
a second stage amplifier comprising a transistor coupled in series with a cascode amplifier circuit, the second stage amplifier operable to receive the first stage output signal and generate a second stage output signal to control the output transistor as a function of the first stage output signal,
wherein the first stage amplifier comprises:
a first high breakdown voltage NMOS transistor as an input transistor; and
an NMOS transistor as a tail current source, and
wherein the cascode amplifier circuit comprises a second high breakdown voltage NMOS transistor as a cascode transistor.

2. The voltage regulator of claim 1, wherein the reference voltage is supplied to the first stage amplifier and the cascode amplifier circuit.

3. The voltage regulator of claim 1, wherein the first high breakdown voltage NMOS transistor comprises a plurality of first high breakdown voltage NMOS transistors, and the reference voltage is supplied to a gate of at least one of the first high breakdown voltage NMOS transistors.

4. The voltage regulator of claim 1, wherein the reference voltage is supplied to a gate of the first high breakdown voltage NMOS transistor and a gate of the second high breakdown voltage NMOS transistor.

5. The voltage regulator of claim 1, wherein the transistor is a PMOS transistor.

6. The voltage regulator of claim 1, wherein the cascode amplifier circuit further comprises an NMOS transistor coupled between the second high breakdown voltage NMOS transistor and a ground connection.

7. The voltage regulator of claim 1, wherein a structure of the first high breakdown voltage NMOS transistor and a structure of the second high breakdown voltage NMOS transistor are substantially identical.

8. A voltage regulator, comprising:
a reference voltage supply terminal;
a first stage amplifier coupled with the reference voltage supply terminal;
a second stage amplifier comprising a transistor coupled with an output of the first stage amplifier, and a cascode amplifier circuit coupled with the reference voltage supply terminal;
an output transistor coupled with an output of the second stage amplifier;
an output terminal coupled with the output transistor, the output terminal providing an output voltage of the voltage regulator;
a voltage divider operable to divide the output voltage, the voltage divider coupled with the output terminal and the first stage amplifier, the first stage amplifier operable to provide, as the output of the first stage amplifier, a difference between the reference voltage and the divided output voltage, and the second stage amplifier is operable to control the output transistor to adjust the output voltage based on the output of the first stage amplifier.

9. The voltage regulator of claim 8, wherein the first stage amplifier comprises a first high breakdown voltage NMOS transistor operable as an input transistor, and an NMOS transistor operable as a tail current source; and
wherein the cascode amplifier circuit comprises an NMOS transistor and a second high breakdown voltage NMOS transistor operable as a cascode transistor.

10. The voltage regulator of claim 9, wherein the first high breakdown voltage NMOS transistor and the second high breakdown voltage NMOS transistor have a similar structure.

11. The voltage regulator of claim 9, wherein a gate of the first high breakdown voltage NMOS transistor and a gate of the second high breakdown voltage NMOS transistor are both coupled with the reference voltage supply terminal.

12. The voltage regulator of claim 9, wherein the second high breakdown voltage NMOS transistor is structured to have lower driveability and higher breakdown voltage than the NMOS transistor.

13. The voltage regulator of claim 8, wherein the output transistor is a PMOS transistor coupled between a power supply terminal and the output terminal, and the voltage divider is coupled between the output terminal and a ground terminal.

14. The voltage regulator of claim 8, wherein the output of the second stage amplifier is coupled with a gate of the output transistor.

15. A voltage regulator, comprising:
an output terminal coupled with an output transistor, an output voltage of the voltage regulator provided on the output terminal;
a voltage divider coupled with the output terminal, the voltage divider operable to divide the output voltage;
a first stage amplifier coupled with voltage divider and a reference voltage supply terminal, an output of the first stage amplifier being a difference signal representative of a difference between the divided output voltage and a reference voltage present on the reference voltage supply terminal; and
a second stage amplifier coupled to the output of the first stage amplifier and the output transistor, the second stage amplifier comprising a cascode amplifier circuit coupled with the reference voltage terminal, the second stage amplifier operable to generate an output signal based on the difference signal to control the output transistor to adjust the output voltage.

16. The voltage regulator of claim 15, wherein the cascode amplifier circuit comprises a high breakdown voltage NMOS transistor coupled with an NMOS transistor, the high breakdown voltage NMOS transistor structured with a lower driveability and a higher breakdown voltage than the NMOS transistor.

17. The voltage regulator of claim 16, wherein the first stage amplifier comprises another high breakdown voltage NMOS transistor coupled with another NMOS transistor, the another NMOS transistor operable as a tail current source of the first stage amplifier, and structured to have higher driveability and lower breakdown voltage than the another high breakdown voltage NMOS transistor.

18. The voltage regulator of claim 15, wherein the first stage amplifier comprises a plurality of high breakdown voltage NMOS transistors operable as input transistors, and the cascode amplifier circuit comprises a high breakdown voltage NMOS transistor, and wherein all of the high breakdown voltage NMOS transistors have a similar structure.

\* \* \* \* \*